United States Patent

Kohda et al.

[11] Patent Number: 5,927,994
[45] Date of Patent: Jul. 27, 1999

[54] METHOD FOR MANUFACTURING THIN FILM

[75] Inventors: Yuzo Kohda, Kyoto; Shotaro Okabe, Nara; Masahiro Kanai; Akira Sakai, both of Kyoto; Tadashi Hori, Nara; Tomonori Nishimoto; Takahiro Yajima, both of Kyoto, all of Japan

[73] Assignee: Canon Kabushiki Kaisha, Tokyo, Japan

[21] Appl. No.: 08/782,811

[22] Filed: Jan. 13, 1997

[30] Foreign Application Priority Data

Jan. 17, 1996 [JP] Japan .................................. 8-023288

[51] Int. Cl.$^6$ ............................ H01L 21/20; H01L 21/36
[52] U.S. Cl. .......................................................... 438/478
[58] Field of Search ................................ 438/478, 479, 438/482, 488, 492, 493, 497, 500, 503, 507

[56] References Cited

U.S. PATENT DOCUMENTS

| | | | |
|---|---|---|---|
| 4,400,409 | 8/1983 | Izu et al. | 427/39 |
| 4,690,746 | 9/1987 | McInerny et al. | 204/192.32 |
| 4,767,641 | 8/1988 | Kieser et al. | 427/38 |
| 5,102,523 | 4/1992 | Beiswenger et al. | 204/298.33 |
| 5,763,937 | 7/1997 | Jain et al. | 257/646 |

FOREIGN PATENT DOCUMENTS

4233895A1   4/1994   Germany .

*Primary Examiner*—Charles Bowers
*Assistant Examiner*—Craig Thompson
*Attorney, Agent, or Firm*—Fitzpatrick, Cella, Harper & Scinto

[57] ABSTRACT

A method of manufacturing thin films by plasma CVD is described. This method comprises supplying power to a power electrode in a way such that a self-bias upon plasma discharge of the power applying electrode, which is situated in a plasma discharge space, is a positive potential relative to a ground electrode.

11 Claims, 9 Drawing Sheets

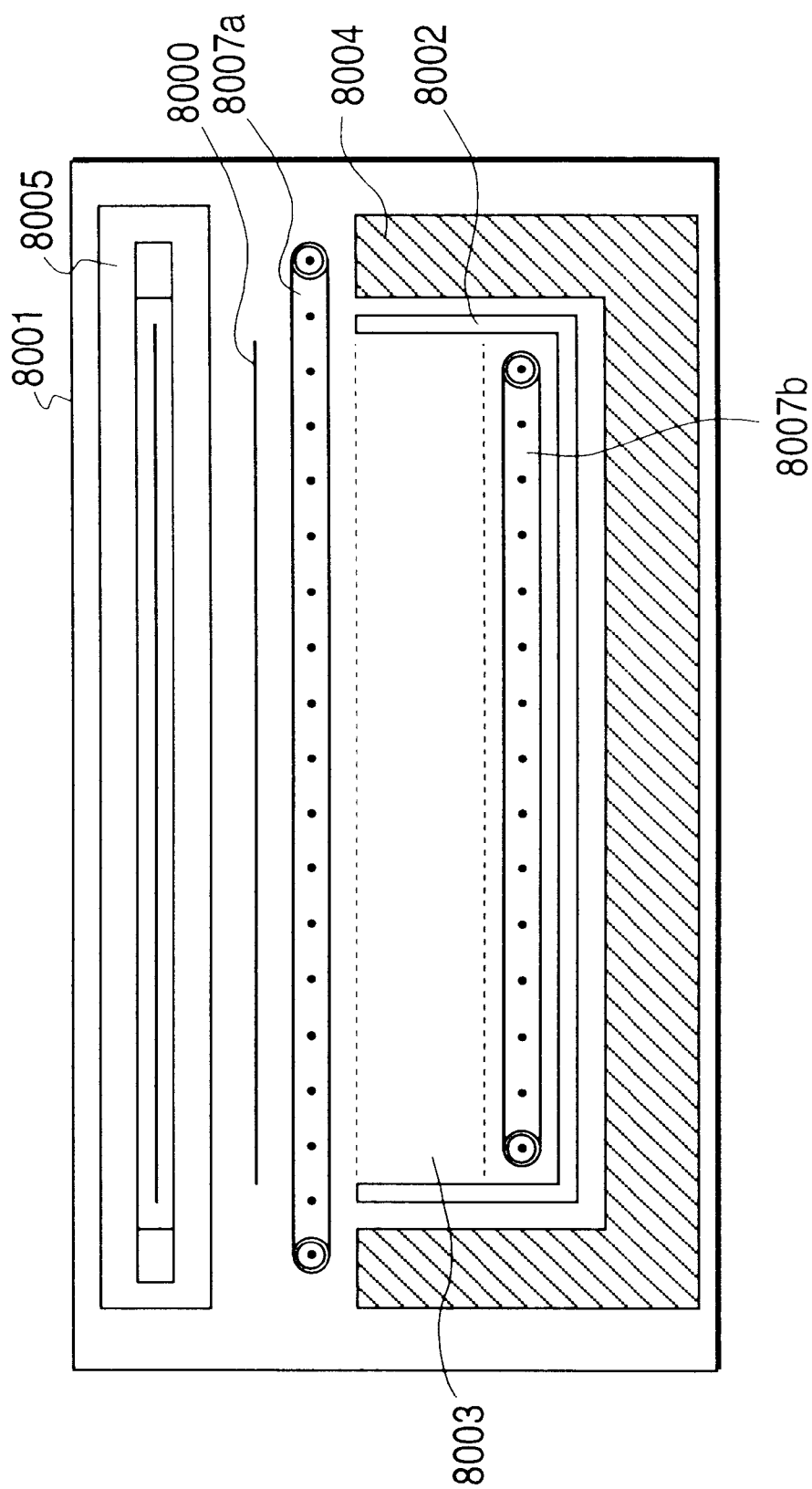

METHOD FOR MANUFACTURING THIN FILM

BACKGROUND OF THE INVENTION

1. Field of the Invention

The present invention relates to a plasma CVD apparatus for uniformly depositing a semiconductor thin film on a substrate, with excellent electric characteristics and to a method for manufacturing a thin film. More particularly, the invention relates to a method and apparatus for continuously fabricating a photovoltaic element comprising a microcrystal thin film on an elongated substrate.

2. Related Background Art

As a method for continuously forming a semiconductor functional deposited film, used for photovoltaic elements or the like, on a substrate, the specification of U.S. Pat. No. 4,400,409 discloses the plasma CVD process employing the roll-to-roll method.

This process is described as being capable of continuously forming an element having a semiconductor junction by using an elongate beltlike member as a substrate, and continuously conveying the substrate in the longitudinal direction thereof while depositing necessary conductivity-type semiconductor layers thereon in a plurality of glow discharge regions.

A schematic diagram of a conventional deposition apparatus is shown in FIG. 2. A beltlike member 2000 is conveyed by magnet roller 2005. When electric power is applied between cathode electrode 2002 and anode electrode 2004, material gas 2003 is decomposed to generate a plasma in a glow discharge space 2006 and to form a film on the beltlike member 2000. In FIG. 2 the arrow 2003 represents the flow of the material gas.

The above apparatus, however, has a problem that it is not easy to maintain uniform discharge states with good reproducibility during a period of several hours for depositing the film over the entire length of the elongated substrate.

Further, a light-incident-side doped layer of amorphous silicon solar cell is desirably microcrystallized due to demand for improvement in optical transparency.

As conventional techniques for forming a microcrystalline p-type semiconductor layer or n-type semiconductor layer, there are a method for mixing phosphine ($PH_3$), diborane ($B_2H_6$), or the like as a dopant in silane ($SiH_4$) or the like being the material gas and for further diluting it with a large amount of hydrogen ($H_2$) (in the dilution rate of 10 to 100 or more) and a method for applying high radio-frequency (RF) power, but they were not enough to stably form the microcrystalline film. The reason is that excitation and decomposition of the material gas is promoted only in a certain localized portion in the proximity of the cathode electrode. Also, these methods consume a lot of both raw-material gas and power, thus being disadvantageous from a viewpoint of cost.

Further, there is another conventional technique for positively applying a positive potential (bias) to the cathode electrode using direct-current (DC) power supply or the like. However, since such a system employs the secondary means of DC power supply, it is a system to permit direct current to flow into plasma discharge. Therefore, abnormal discharge such as sparks will occur with increasing DC voltage bias. It was thus very difficult to maintain stable discharge as suppressing the abnormal discharge. Accordingly, it was doubtful whether application of the DC voltage to the plasma discharge was effective. This is because the system is one in which the DC voltage is not separated from the direct current. In other words, it has been desired to have a means for effectively applying only the DC voltage to the plasma discharge.

An object of the present invention is to provide a method and deposition apparatus capable of forming a semiconductor thin film which is spatially uniform and excellent in electric characteristics, with good reproducibility, and at a high deposition rate.

SUMMARY OF THE INVENTION

The deposition apparatus of the present invention is arranged so that a surface area of an RF power applying cathode electrode disposed in a glow discharge space, in a space in contact with discharge is greater than a surface area of the whole of a ground electrode (anode electrode) including a beltlike member in the discharge space.

This solves the problem that excitation and decomposition of material gas is promoted only in a certain limited portion near the cathode electrode, which was the defect in the conventional technology. Namely, the above-stated excitation and decomposition of material gas is promoted in the entire discharge space, more specifically, on the anode electrode side including the beltlike member. As a result, a high-quality thin film can be deposited efficiently and at a relatively high deposition rate on the beltlike member.

By this structure, the potential (self-bias) of the cathode electrode disposed in the glow discharge space can be maintained automatically at a positive potential with respect to the ground (anode) electrode including the beltlike member.

As a result, the bias is applied in the direction of irradiation of the positively charged ions to the deposited film on the beltlike member, and therefore, the ions existing in the plasma discharge are accelerated more efficiently toward the beltlike member. Thus, they effectively give energy to the surface of the deposited film by so-called ion bombardment. Therefore, since structural relaxation of the film is promoted even at relatively high deposition rates, the microcrystalline semiconductor film can be formed at relatively high deposition rates with good efficiency, with high uniformity, and with good reproducibility.

The method and apparatus of the present invention can be applied not only to film formation of the light-incident-side doped layer, but also to film formation of the i-layer and opposite-side doped layer with the i-layer inbetween. These films do not always have to be microcrystallized, but application of the apparatus and method of the present invention promotes the structural relaxation more, thus permitting formation of films with fewer defects.

The potential (self-bias) of the cathode electrode upon glow discharge is desirably +5 V or more upon deposition of the i-layer and +30 V or more upon formation of the doped layers. More desirably, it is maintained at +100 V or more.

Further, the apparatus may be so arranged that it has means capable of introducing different gas species independently of each other through a plurality of gas inlet tubes to one film-forming container, at least one of which is a dedicated inlet tube for supplying a dopant or an additive such as germanium, carbon, nitrogen, or oxygen and has structure capable of supplying the dopant or additive to near the surface of the beltlike member and another of which is for supplying a material gas such as silane becoming a source for forming the film and a diluent gas such as hydrogen and has structure capable of supplying the gases to a region relatively apart from the beltlike member.

When the dopant is supplied to near the surface of deposited film, more doping gas molecules adhere to the surface of the deposited film and the ions effectively give energy to the adhering doping gas molecules, which improves the doping efficiency of dopant and which, at the same time, enhances the quality and fineness of the film. Therefore, a low-resistance microcrystalline semiconductor thin film can be obtained relatively easily.

When the additive is supplied near the surface of the deposited film, more additive gas molecules adhere to the surface of deposit film and the ions effectively give energy to the adhering additive gas molecules, which results in decomposing and activating the additive more effectively, so as to promote the structural relaxation of atoms, thereby enhancing the quality and fineness of film.

Examples of the raw-material gas suitable for deposition of the p-layer, n-layer, and i-layer of photovoltaic element of the present invention are gasifiable compounds containing silicon atoms, gasifiable compounds containing germanium atoms, gasifiable compounds containing carbon atoms, etc., and mixtures of gases of the mentioned compounds.

Specific examples of the gasifiable compounds containing silicon atoms are $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $SiD_3H$, $Si_2D_3H_3$, and so on.

Specific examples of the gasifiable compounds containing germanium atoms are $GeH_4$, $GeD_4$, $GeF_4$, $GeFH_3$, $GeF_2H_2$, $GeF_3H$, $GeHD_3$, $GeH_2D_2$, $GeH_3D$, $Ge_2H_6$, $Ge_2D_6$, and so on.

Specific examples of the gasifiable compounds containing carbon atoms are $CH_4$, $CD_4$, $C_nH_{2n+2}$ (n is an integer), $C_nH_{2n}$ (n is an integer), $C_2H_2$, $C_6H_6$, $CO_2$, CO, and so on.

Examples of gas containing nitrogen atoms are $N_2$, $NH_3$, $ND_3$, NO, $NO_2$, and $N_2O$.

Examples of gas containing oxygen atoms are $O_2$, CO, $CO_2$, NO, $NO_2$, $N_2O$, $CH_3CH_2OH$, $CH_3OH$, and so on.

Examples of the substance introduced into the p-type layer or the n-type layer in order to control the valence electrons in the present invention are the atoms in Group III and the atoms in Group V in the periodic table.

Materials effectively used as a starting substance for introduction of the atoms in Group III in the present invention, specifically for introduction of boron atoms, are boron hydrides such as $B_2H_6$, $B_4H_{10}$, $B_5H_9$, $B_5H_{11}$, $B_6H_{10}$, $B_6H_{12}$, and $B_6H_{14}$, boron halides such as $BF_3$ and $BCl_3$, and so on. Additional examples are $AlCl_3$, $GaCl_3$, $InCl_3$, $TlCl_3$, and so on. Particularly, $B_2H_6$ and $BF_3$ are suitable.

Materials effectively used as a starting substance for introduction of the atoms in Group V in the present invention, specifically for introduction of phosphorus atoms, are phosphorus hydrides such as $PH_3$ and $P_2H_4$, phosphorus halides such as $PH_4I$, $PF_3$, $PF_5$, $PCl_3$, $PCl_5$, $PBr_3$, $PBr_5$, and $PI_3$, and so on. In addition, other examples are $AsH_3$, $AsF_3$, $AsCl_3$, $AsBr_3$, $AsF_5$, $SbH_3$, $SbF_3$, $SbF_5$, $SbCl_3$, $SbCl_5$, $BiH_3$, $BiCl_3$, $BiBr_3$, and so on. Particularly, $PH_3$ and $PF_3$ are suitable.

Further, the foregoing gasifiable compounds may be introduced into a deposition chamber as being diluted properly with a gas such as $H_2$, He, Ne, Ar, Xe, or Kr.

BRIEF DESCRIPTION OF THE DRAWINGS

FIGS. 8A and 8B are cross-sectional views of a deposit film forming apparatus of the present invention.

DESCRIPTION OF THE PREFERRED EMBODIMENTS

The apparatus and method of the present invention will be described with reference to the drawings, but it is noted that the present invention is by no means limited to these.

Apparatus Example 1

Figure 1A:
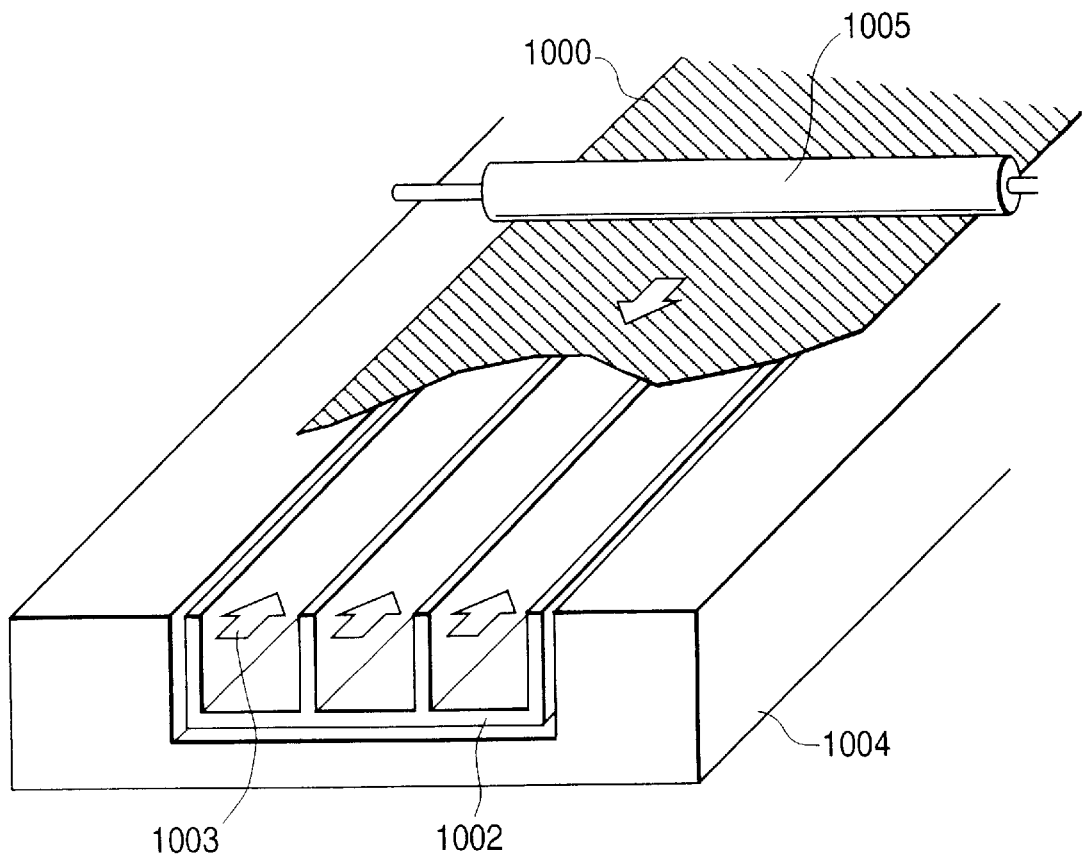
FIG. 1A is a conceptual schematic drawing to show an example of the discharge space in the deposited film forming apparatus using the cathode electrode of the present invention.

FIG. 1A is a schematic drawing to show the feature in the discharge container of the present invention. It is constructed so that the cathode electrode 1002 having the same structure as the example of the cathode electrode shown in FIG. 1E is set as electrically insulated on the ground (anode) electrode 1004 and that an electroconductive beltlike member 1000 moves in the direction of the arrow 1003 without physical contact with the lower cathode electrode and with the anode electrode as being supported by a plurality of magnet rollers above the cathode electrode.

A material suitably applicable for the cathode electrode and anode electrode is stainless steel or aluminum.

The material gas flows in the direction of arrows as passing through the space between partitions of the cathode electrode and is then evacuated by an unrepresented evacuation apparatus.

RF power is supplied from an unrepresented RF power supply to the cathode electrode. The discharge region of glow discharge induced is the space between the partitions of the cathode electrode, which is a region confined by the upper electroconductive beltlike member.

In the case of use of the discharge container in such structure, the ratio of the area of the cathode electrode to the area of the ground anode electrode including the beltlike member is clearly greater than 1.

The configuration of the cathode electrode of the present invention is not limited to this, and some other examples will be shown.

FIG. 1B, FIG. 1C, FIG. 1D, FIG. 1E, FIG. 1F, and FIG. G show examples of schematic views of configurations of the cathode electrode, used in the method and apparatus of the present invention.

Figure 1B:
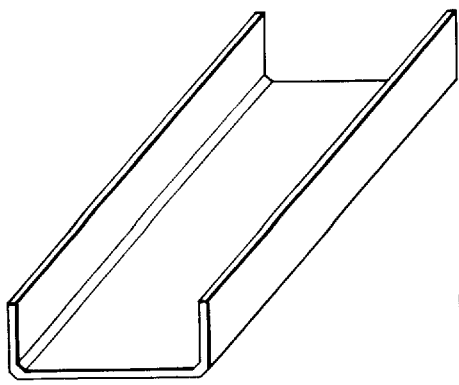
FIGS. 1B, 1C, 1D, 1E, 1F and 1G are conceptual schematic drawings each of which shows another example of the cathode electrode of the present invention.

FIG. 1B is an example wherein the cross section of the cathode configuration is of a U-shape.

Figure 1C:
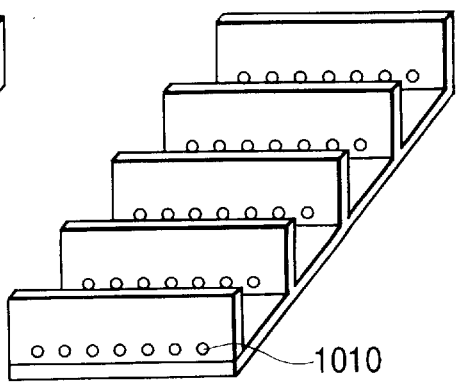
Figure 1D:
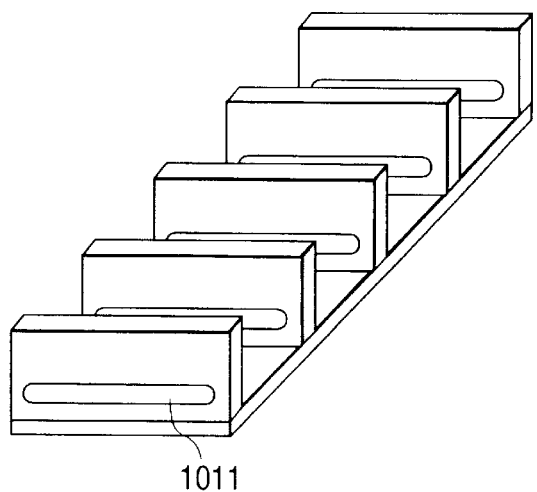
Figure 1E:
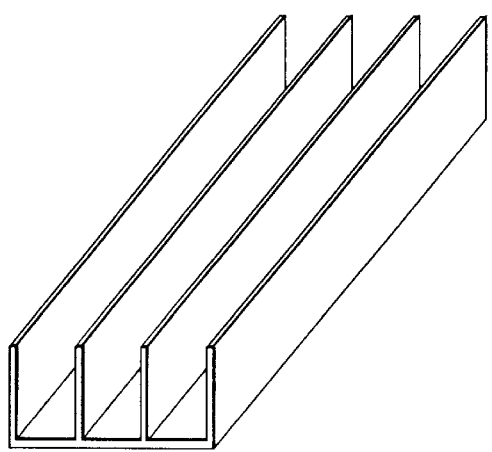

FIG. 1C is an example of structure in which a plurality of fin-shaped partitions are provided along the direction perpendicular to the conveying direction of the beltlike member. It is the structure in which a plurality of vents or gas passing holes 1010 for letting the material gas pass are provided in the partitions. The gas passing holes may be formed so as to have the size for permitting the material gas to pass and so as not to damage the function as a cathode electrode and they may be formed as in an example of structure shown in FIG. 1D, for example. In FIG. 1D, numeral 1011 designates gas passing holes.

FIG. 1E shows an example of structure in which a plurality of fin-shaped partitions are provided in parallel with the conveying direction of the beltlike member.

Figure 1F:
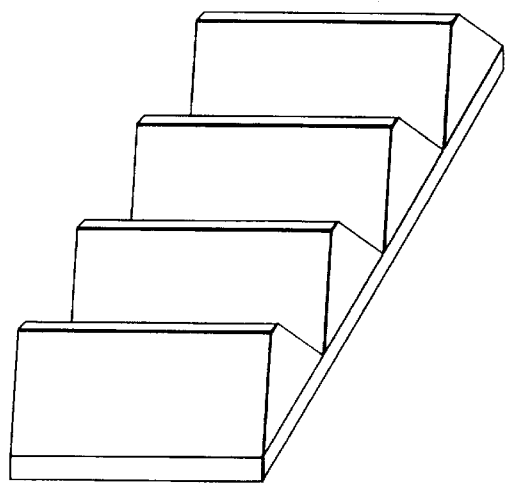
Figure 1G:
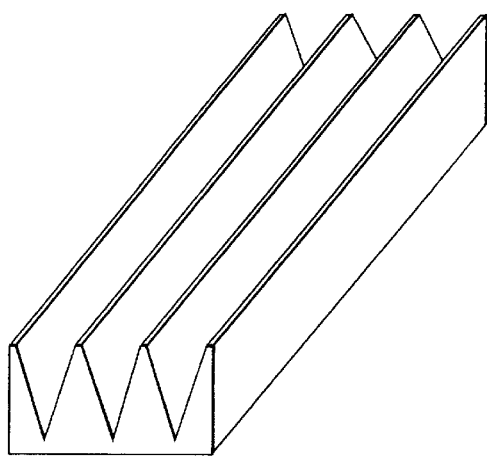

FIGS. 1F and 1G show examples wherein the partitions are of a block shape and a cross section thereof is of a chevron shape. These configurations of the cathode electrode can be formed by cutting. Alternatively, they may be formed by bending a flat plate in the chevron shape.

Example 1 (single cell) of fabrication of photovoltaic element

The discharge container as shown in FIG. 1A was used for fabrication of the p-layer and n-layer of a pin type photovoltaic element. The ratio of the area of the cathode to the overall area of the ground anode including the electroconductive beltlike member was 1.5.

Figure 3:
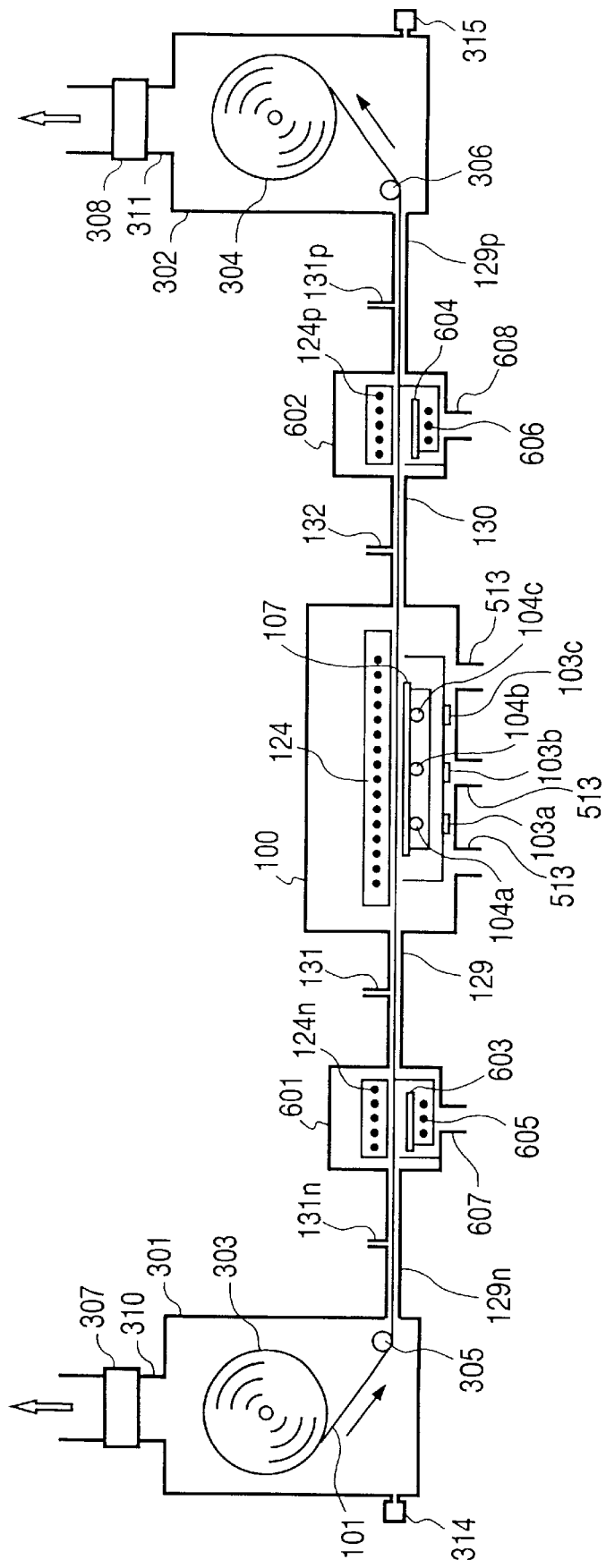
FIG. 3 is an example of a photovoltaic element manufacturing apparatus of the roll-to-roll method employing the method of the present invention.

FIG. 3 is a schematic drawing of the manufacturing apparatus. This example of the manufacturing apparatus is comprised of vacuum containers 301 and 302 for delivery and for winding of the beltlike member 101, a vacuum container 601 for fabrication of the first-conductivity-type layer, a vacuum container 100 for fabrication of the i-type layer, and a vacuum container 602 for fabrication of the second-conductivity-type layer, connected through a gas gate.

In FIG. 3, numerals 307 and 308 designate conductance valves; 124n, 124 and 124p lamp heaters; 603 and 107 cathode electrodes; 314 and 315 pressure gauges; 605 and 606 gas inlet tubes; and 513 and 608 exhaust tubes.

The structure of the cathode electrode 603 in the vacuum container 601 and the cathode electrode 604 in the vacuum container 602 was the same cathode electrode structure as described above.

Using the manufacturing apparatus shown in FIG. 3, the first-conductivity-type layer, i-type layer, and second-conductivity-type layer were successively deposited on the lower electrode under the fabrication conditions shown in Table 1 and in accordance with the fabrication procedures described below, thereby continuously fabricating the single type photovoltaic element (Elem-Ex 1).

First set in the vacuum container 301 having a substrate delivery mechanism was a bobbin 303 on which the beltlike member 101 (120 mm wide×200 m long×0.13 mm thick), made of SUS430BA sufficiently degreased and cleaned and having a silver thin film 100 nm thick and a ZnO thin film 1 μm thick deposited as a lower electrode by sputtering, was wound; then the beltlike member 101 was passed through the gas gates 129n, 129, 130, 129p and the vacuum containers for fabrication of the respective non-monocrystal layers up to the vacuum container 302 having a beltlike member winding mechanism; and the tension thereof was adjusted so as to eliminate slack.

The beltlike member may be one obtained by forming an electroconductive thin film of aluminum or the like on a heat-resistant resin such as polyimide.

Next, each vacuum container 301, 601, 100, 602, 302 was vacuumized down to 1×10−4 or less Torr by an unrepresented vacuum pump.

Next, $H_2$ as a gate gas was introduced at 700 sccm through a gate gas inlet tube 131n, 131, 132, 131p to each gas gate.

The substrate temperature, gas flow rate, and pressure in each vacuum chamber were set in the conditions of Table 1.

Next, the RF power was supplied under the conditions of Table 1 to the cathode electrode 603 in each deposition chamber.

Next, the beltlike member 101 was conveyed in the direction of arrows in the drawing, so that the first-conductivity-type layer, i-type layer, and second-conductivity-type layer were made on the beltlike member.

Next, ITO ($In_2O_3+SnO_2$) was evaporated in the thickness of 80 nm as a transparent electrode over the second-conductivity-type layer by vacuum vapor deposition, and further, Al was evaporated in the thickness of 2 μm as a collector electrode by vacuum vapor deposition, thus preparing the photovoltaic element.

Figure 4:
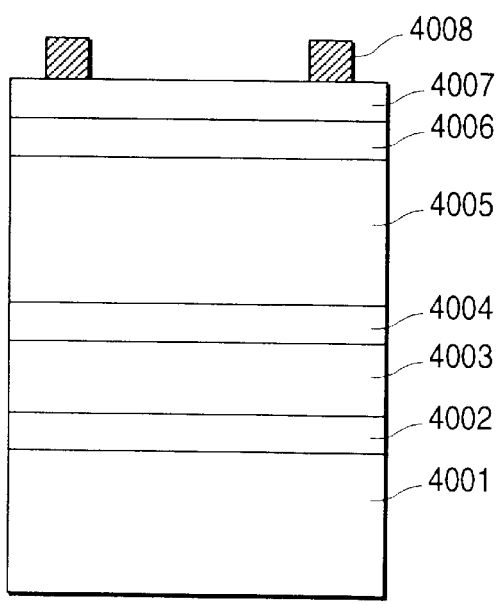
FIG. 4 is a cross-sectional view of a single type photovoltaic element.
Figure 5:
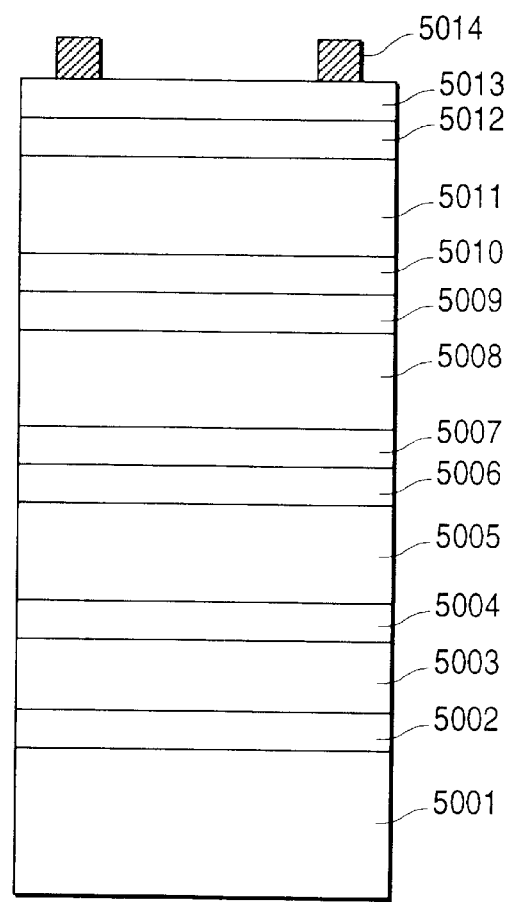
FIG. 5 is a cross-sectional view of a triple type photovoltaic element.

A cross section of the element is shown in FIG. 4.

TABLE 1

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| 1st-conductivity type layer | 40 | $SiH_4$ 40 $PH_3/H_2$ 50 (2% dil) $H_2$ 500 | 500 | 1.5 | 350 |
| i-type layer | 150 | $SiH_4$ 100 each $H_2$ 500 each | 200 | 1.8 | 350 |
| 2nd-conductivity type layer | 20 | $SiH_4$ 10 $BF_3/H_2$ 100 (2% dil) $H_2$ 2000 | 500 | 1.6 | 200 |

Transparent electrode: ITO ($In_2O_3$ + $SnO_2$) thin film 80 nm
Collector electrode: Aluminum (Al) thin film 2 μm Comparative Example 1

Figure 2:
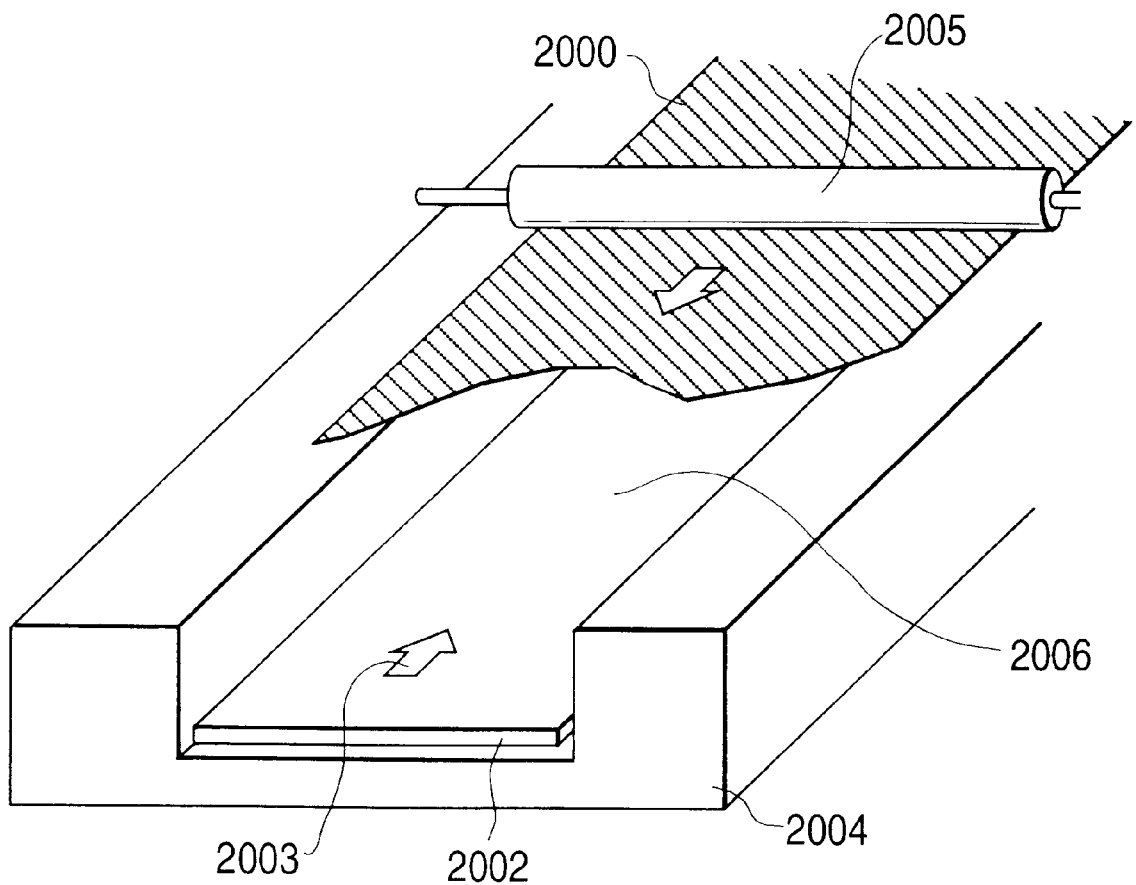
FIG. 2 is a conceptual schematic drawing to show an example of the discharge space of the photovoltaic element manufacturing apparatus using the conventional cathode electrode.

The structure of the cathode electrode 603 in the vacuum container 601 and the cathode electrode 604 in the vacuum container 602 was the conventional cathode electrode structure shown in FIG. 2. Namely, the ratio of the area of the cathode to the total area of the ground anode including the electroconductive beltlike member was 0.6.

A single type photovoltaic element was fabricated according to the same procedures as in Example 1 except that the fabrication conditions were as shown in Table 2 (Elem-Comp 1).

TABLE 2

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| 1st-conductivity | 40 | $SiH_4$ 40 $PH_3/H_2$ 50 | 800 | 1.5 | 350 |

TABLE 2-continued

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| type Layer i-type layer | 150 | (2% dil) H$_2$ 500 SiH$_4$ 100 each H$_2$ 500 each | 200 | 1.8 | 350 |
| 2nd-conductivity type Layer | 20 | SiH$_4$ 10 BF$_3$/H$_2$ 100 (2% dil) H$_2$ 2000 | 800 | 1.6 | 200 |

Transparent electrode: ITO (In$_2$O$_3$ + SnO$_2$) thin film 80 nm
Collector electrode: Aluminum (Al) thin film 2 μm Cross-sectional TEM images were observed of the photovoltaic elements fabricated in Example 1 (Elem-Ex 1) and in Comparative Example 1 (Elem-Comp 1). As a result, microcrystal grains were observed with Elem-Ex 1, but were not observed with Elem-Comp 1. A conceivable reason of this is that in the present invention the self-bias of the cathode is positive because of the large ratio of the cathode area to the total anode area, which promoted microcrystallization.

Experiments were conducted to check the relation of self-bias of cathode versus ratio of cathode area to anode area. In the cathode electrode of the configuration as shown in FIG. 1E, the number and size of plural partitions provided in parallel or perpendicularly to the conveying direction of the beltlike member were charged so as to change the ratio of the surface area of the cathode electrode to the anode area between 1.00 and 2.00, while the values of the self-bias occurring in the cathode electrode were also checked. The results are shown in Table 3.

TABLE 3

| Ratio of cathode area to anode area (%) | Self-bias of cathode electrode (V) |
|---|---|
| 60 | −140 |
| 100 | −20 |
| 110 | +30 |
| 120 | +40 |
| 150 | +90 |
| 200 | +190 |

After the ratio of the cathode area to the anode exceeds approximately 100%, the potential (self-bias) of the cathode electrode is found to become positive (or plus).

In order to evaluate the effect of microcrystallization of the deposited film, areas 5 cm square were cut out at intervals of 10 m from each of Elem-Ex 1 Elem-Comp 1 and were subjected to evaluation of conversion efficiency, characteristic uniformity, and yield.

Current-voltage characteristics were evaluated by setting the elements under irradiation of AM-1.5 (100 mW/cm$^2$) light and measuring their photoelectric conversion factors. The results are shown in Table 4. Each value is a relative value when each characteristic of Elem-Comp 1 is referenced to 1.00. The characteristics of Elem-Ex 1 were totally improved as compared with those of Elem-Comp 1, and especially, an improvement in open-circuit voltage resulted in an improvement of 1.07 times the conversion efficiency.

TABLE 4

| Elem. No. | Micro crystal grain | Self-bias upon form of 1st-conductivity type layer (V) | Self-bias upon form of 2nd-conductivity type layer (V) | Conversion Efficiency | Open circuit Voltage | Current Density | F.F. |
|---|---|---|---|---|---|---|---|
| Elem-Ex 1 | Yes | +100 | +110 | 1.07 | 1.05 | 1.01 | 1.01 |
| Elem-Comp 1 | No | −150 | −160 | 1.00 | 1.00 | 1.00 | 1.00 |

Next evaluated was the dispersion of photoelectric conversion efficiency. The reciprocal of magnitude of dispersion was obtained with reference to the photovoltaic element of Comparative Example 1 (Elem-Comp 1).

The yield was evaluated by measuring shunt resistance in a dark condition, counting elements with resistance values not less than 1×10$^3$ Ωcm$^2$ as non-defective, and obtaining a percentage of non-defective elements in the total number.

TABLE 5

| Element No. | Dispersion of conversion efficiency | Yield (%) |
|---|---|---|
| Elem-Ex 1 | 1.18 | 98 |
| Elem-Comp 1 | 1.00 | 94 |

As shown in Table 4, the photovoltaic element of Example 1 (Elem-Ex 1) was superior in both characteristic uniformity and yield to the photovoltaic element of Comparative Example 1 (Elem-Comp 1), so that the single type photovoltaic element fabricated by the fabrication method of the present invention was found to have the excellent characteristics, thus proving the effect of the present invention.

Example 2 (triple cell) of fabrication of photovoltaic element

Defining as one set a system in which the vacuum container 601 for fabrication of the first-conductivity-type layer, the vacuum container 100 for fabrication of the i-type layer, and the vacuum container 602 for fabrication of the second-conductivity-type layer were connected through a gas gate, two more sets were added so as to make a system in such an arrangement that the three sets in total were repetitively arranged in series, in which the cathode electrode structure of the all first-conductivity-type layer forming containers and the second-conductivity-type layer forming containers was the above-stated cathode electrode structure. Using such a system, the triple type photovoltaic element (Elem-Ex 2) was fabricated.

The fabrication conditions of the photovoltaic element are shown in Table 6.

TABLE 6

Substrate: SUS430BA 0.13 mm thick
Reflective layer: Silver (Ag) thin film 100 nm
Reflection enhancing layer: Zinc oxide (ZnO) thin film 1μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| 1st-conductivity type layer | 40 | $SiH_4$ 40<br>$PH_3/H_2$ 50<br>(2% dil)<br>$H_2$ 500 | 500 | 1.5 | 350 |
| 1st i-type layer | 100 | $SiH_4$ 50 each<br>$GeH_4$ 50 each<br>$H_2$ 500 each | 200 | 1.8 | 350 |
| 2nd-conductivity type layer | 20 | $SiH_4$ 10<br>$BF_3/H_2$ 100<br>(2% dil)<br>$H_2$ 2000 | 500 | 1.6 | 200 |
| 1st-conductivity type layer | 40 | $SiH_4$ 40<br>$PH_3/H_2$ 50<br>(2% dil)<br>$H_2$ 500 | 500 | 1.5 | 350 |
| 2nd i-type layer | 100 | $SiH_4$ 60 each<br>$GeH_4$ 40 each<br>$H_2$ 500 each | 200 | 1.8 | 350 |
| 2nd-conductivity type layer | 20 | $SiH_4$ 10<br>$BF_3/H_2$ 100<br>(2% dil)<br>$H_2$ 2000 | 500 | 1.6 | 200 |
| 1st-conductivity type layer | 40 | $SiH_4$ 40<br>$PH_3/H_2$ 50<br>(2% dil)<br>$H_2$ 500 | 500 | 1.5 | 350 |
| 3rd i-type layer | 90 | $SiH_4$ 100 each<br>$H_2$ 500 each | 200 | 1.8 | 200 |
| 2nd-conductivity type layer | 20 | $SiH_4$ 10<br>$BF_3/H_2$ 100<br>(2% dil)<br>$H_2$ 2000 | 500 | 1.6 | 200 |

TABLE 6-continued

Substrate: SUS430BA 0.13 mm thick
Reflective layer: Silver (Ag) thin film 100 nm
Reflection enhancing layer: Zinc oxide (ZnO) thin film 1μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|

Transparent electrode: ITO ($In_2O_3$ + $SnO_2$) thin film 80 nm
Collector electrode: Aluminum (Al) thin film 2 μm Comparative Example 2

A triple type photovoltaic element was fabricated in the same procedures as those in Example 2 except that the cathode electrode structure for the first-conductivity-type layers and the second-conductivity-type layers was the cathode electrode structure shown in FIG. 2 (in this case, the ratio of the cathode area to the total area of the ground anode including the electroconductive beltlike member was 0.6) and that the fabrication conditions as shown in Table 7 were employed (Elem-Comp 2).

TABLE 7

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| 1st-conductivity type layer | 40 | $SiH_4$ 40<br>$PH_3/H_2$ 50<br>(2% dil)<br>$H_2$ 500 | 800 | 1.5 | 350 |
| 1st i-type layer | 100 | $SiH_4$ 50 each<br>$GeH_4$ 50 each<br>$H_2$ 500 each | 200 | 1.8 | 350 |
| 2nd-conductivity type layer | 20 | $SiH_4$ 10<br>$BF_3/H_2$ 100<br>(2% dil)<br>$H_2$ 2000 | 800 | 1.6 | 200 |
| 1st-conductivity type layer | 40 | $SiH_4$ 40<br>$PH_3/H_2$ 50<br>(2% dil)<br>$H_2$ 500 | 800 | 1.5 | |
| 2nd i-type layer | 100 | $SiH_4$ 60 each<br>$GeH_4$ 40 each<br>$H_2$ 500 each | 200 | 1.8 | 350 |
| 2nd-conductivity type layer | 20 | $SiH_4$ 10<br>$BF_3/H_2$ 100<br>(2% dil)<br>$H_2$ 2000 | 800 | 1.6 | 200 |
| 1st-conductivity type layer | 40 | $SiH_4$ 40<br>$PH_3/H_2$ 50<br>(2% dil)<br>$H_2$ 500 | 800 | 1.5 | 350 |
| 3rd i-type layer | 90 | $SiH_4$ | 200 | 1.8 | 200 |

TABLE 7-continued

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| type layer | | 100 each H$_2$ 500 each | | | |
| 2nd-conductivity type layer | 20 | SiH$_4$ 10 BF$_3$/H$_2$ 100 (2% dil) H$_2$ 2000 | 800 | 1.6 | 200 |

Transparent electrode: ITO (In$_2$O$_3$ + SnO$_2$) thin film 80 nm
Collector electrode: Aluminum (Al) thin film 2 μm Evaluation of the conversion efficiency, characteristic uniformity, and yield was carried out in the same manner as in Example 1 for the photovoltaic elements fabricated in Example 2 (Elem-Ex 2) and Comparative Example 2 (Elem-Comp 2).

TABLE 8

| Elem. No. | Self-bias upon form of 1st-conductivity type layers (V) | Self-bias upon form of 2nd-conductivity type layers (V) | Conversion Efficiency | Open-circuit Voltage | Current Density | F.F. |
|---|---|---|---|---|---|---|
| Elem-Ex 2 | +100 | +110 | 1.06 | 1.04 | 1.01 | 1.01 |
| Elem-Comp 2 | −150 | −160 | 1.00 | 1.00 | 1.00 | 1.00 |

TABLE 9

| Element No. | Dispersion of conversion efficiency | Yield (%) |
|---|---|---|
| Elem-Ex 2 | 1.17 | 99 |
| Elem-Comp 2 | 1.00 | 94 |

As shown in Table 8 and Table 9, the photovoltaic element of Example 2 (Elem-Ex 2) was superior in both characteristic uniformity and yield to the photovoltaic element of Comparative Example 2 (Elem-Comp 2), so that the triple type photovoltaic element fabricated by the fabrication method of the present invention was found to have the excellent characteristics, thus proving the effect of the present invention.

Examples 3 to 6 of fabrication of photovoltaic element (examination of deposition rate)

The flow rate of SiH$_4$ gas introduced into the first-conductivity-type layer forming container was changed in the range of from 30 to 60 sccm, thereby changing the deposition rate. Single type photovoltaic elements were fabricated in the same procedures as in Example 1 except for the above point and except that the fabrication conditions as shown in Table 10 were employed (Elem-Ex 3 to 6).

TABLE 10

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (° C.) |
|---|---|---|---|---|---|
| 1st-conductivity type layer | 40 | SiH$_4$ 30–60 PH$_3$/H$_2$ 50 (2%dil) H$_2$ 500 | 500 | 1.5 | 350 |
| i-type layer | 150 | SiH$_4$ 100 each H$_2$ 500 each | 200 | 1.8 | 350 |
| 2nd-conductivity type layer | 20 | SiH$_4$ 10 BF$_3$/H$_2$ 100 (2%dil) H$_2$ 2000 | 500 | 1.6 | 200 |

Transparent electrode: ITO (In$_2$O$_3$ + SnO$_2$) thin film 80 nm
Collector electrode: Aluminum (Al) thin film 2 μm At the same time as it, values of the self-bias occurring in the cathode electrode were also checked and connection thereof with the characteristics of photovoltaic element was evaluated. The film thickness of the first-conductivity-type layer was kept constant at 40 nm even under any conditions by adjusting the aperture length of the discharge space.

Comparative Examples 3 to 6

Single type photovoltaic element were fabricated in the same procedures as those in Example 3 except that the electrode structure of the cathode electrode for the first-conductivity-type layer was the cathode electrode structure shown in FIG. 2 (in this case, the ratio of the cathode area to the total area of the ground anode including the electro-conductive beltlike member was 0.6) and that the fabrication conditions as shown in Table 11 were employed (Elem-Comp 3 to 6).

TABLE 11

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used gas and Flow Rate (sccm) | RF Power (W) | Pressure (Torr) | Substrate Temp. (° C.) |
|---|---|---|---|---|---|
| 1st-conductivity type | 40 | SiH$_4$ 30–60 PH$_3$/H$_2$ 50 | 800 | 1.5 | 350 |

TABLE 11-continued

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thick-ness of Layer (nm) | Used gas and Flow Rate (sccm) | RF Power (W) | Pres-sure (Torr) | Sub-strate Temp. (°C.) |
|---|---|---|---|---|---|
| layer | | (2%dil) H$_2$ 500 | | | |
| i-type layer | 150 | SiH$_4$ 100 each H$_2$ 500 each | 200 | 1.8 | 350 |
| 2nd-conduc-tivity type layer | 20 | SiH$_4$ 10 BF$_3$/H$_2$ 100 (2%dil) H$_2$ 2000 | 800 | 1.6 | 200 |

Transparent electrode: ITO (In$_2$O$_3$ + SnO$_2$) thin film 80 nm
Collector electrode: Aluminum (Al) thin film 2 μm Results of measurement and evaluation of photoelectric conversion efficiency are shown in Table 12. Each value is an arbitrary value when each characteristic of Elem-Comp 3 is referenced to 1.00.

TABLE 12

| Element No. | Deposition rate of 1st-conduc-tivity type layer (Å/sec) | Self-bias of 1st-conduc-tivity type layer (V) | Open-circuit Voltage | Conver-sion Effi-ciency |
|---|---|---|---|---|
| Elem-Ex 3 | 0.6 | +110 | 1.02 | 1.03 |
| Elem-Ex 4 | 1.0 | +108 | 1.02 | 1.03 |
| Elem-Ex 5 | 1.2 | +104 | 1.01 | 1.02 |
| Elem-Ex 6 | 1.5 | +102 | 1.01 | 1.02 |
| Elem-Comp 3 | 0.6 | −160 | 1.00 | 1.00 |
| Elem-Comp 4 | 1.0 | −155 | 0.99 | 0.99 |
| Elem-Comp 5 | 1.2 | −150 | 0.95 | 0.95 |
| Elem-Comp 6 | 1.5 | −146 | 0.93 | 0.93 |

The open-circuit voltages of Elem-Ex 3 to 6 are totally improved as compared with Elem-Comp 3 and as a result, the conversion factors are improved. Especially, where the ratio of the cathode electrode area is set large (Elem-Ex 3 to 6), drops of characteristics can be restricted even at the large deposition rates of not less than 1 Å/sec. On the other hand, where the ratio of the cathode electrode area is set small (Elem-Com 3 to 6), the open-circuit voltages drop with increasing the deposition rates, which decreases the conversion efficiency.

As shown in Table 12, the photovoltaic elements of Example 4 (Elem-Ex 3 to 6) are superior in the conversion efficiency to those of Comparative Example 4 (Elem-Comp 3 to 6), and it was found that as long as the photovoltaic elements were fabricated under the conditions that the cathode area was greater than the anode area and that the self-bias was of a positive potential, the photovoltaic elements would have excellent characteristics even with increasing deposition rates, thus proving the effect of the present invention.

Example 7 of fabrication of photovoltaic element (example of application to the i-layer)

The discharge container as shown in FIG. 1A was used for fabrication of the i-layer of a pin type photovoltaic element (Elm-Ex 7). The ratio of the area of the cathode to the overall area of the ground anode including the electroconductive beltlike member was 1.5.
The fabrication conditions are shown in Table 13.

TABLE 13

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thick-ness of Layer (nm) | Used Gas and Flow Rate (sccm) | RF Power (W) | Pres-sure (Torr) | Sub-strate Temp. (°C.) |
|---|---|---|---|---|---|
| 1st-conduc-tivity type layer | 40 | SiH$_4$ 40 PH$_3$/H$_2$ 50 (2%dil) H$_2$ 500 | 800 | 1.5 | 350 |
| i-type layer | 140 | SiH$_4$ 80 H$_2$ 200 | 100 | 1.8 | 300 |
| 2nd-conduc-tivity type layer | 20 | SiH$_4$ 10 BF$_3$/H$_2$ 100 (2%dil) H$_2$ 2000 | 800 | 1.6 | 250 |

Transparent electrode: ITO (In$_2$O$_3$ + SnO$_2$) thin film 80 nm
Collector electrode: Aluminum (Al) thin film 2 μm Comparative Example 7

A single type photovoltaic element was fabricated in the same procedures as those in Example 7 except that the electrode structure of the cathode electrode for the i-layer was the cathode electrode structure shown in FIG. 2 (in this case, the ratio of the cathode area to the total area of the ground anode including the electroconductive beltlike member was 0.6) and that the fabrication conditions as shown in Table 14 were employed (Elem-Comp 7).

TABLE 14

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thick-ness of Layer (nm) | Used Gas and Flow Rate (sccm) | RF Power (W) | Pres-sure (Torr) | Sub-strate Temp. (°C.) |
|---|---|---|---|---|---|
| 1st-conduc-tivity type layer | 40 | SiH$_4$ 40 PH$_3$/H$_2$ 50 (2%dil) H$_2$ 500 | 800 | 1.5 | 350 |
| i-type layer | 140 | SiH$_4$ 100 H$_2$ 500 | 200 | 1.8 | 300 |
| 2nd- | 20 | SiH$_4$ 10 | 800 | 1.6 | 250 |

TABLE 14-continued

Substrate: SUS430BA 0.13 mm thick
Reflective layer: Silver (Ag) thin film 100 nm
Reflection enhancing layer: Zinc oxide (ZnO) thin film 1 µm
Gate gas: 700 sccm from each gate

| Name of Layer | Thickness of Layer (nm) | Used Gas and Flow Rate (sccm) | RF Power (W) | Pressure (Torr) | Substrate Temp. (°C.) |
|---|---|---|---|---|---|
| conductivity type layer | | $BF_3/H_2$ 100 (2%dil) $H_2$ 2000 | | | |

Transparent electrode: ITO ($In_2O_3$ + $SnO_2$) thin film 80 nm
Collector electrode: Aluminum (Al) thin film 2 µm Evaluation of the conversion efficiency, characteristic uniformity, and yield was carried out in the same manner as in Example 1 for the photovoltaic elements fabricated in Example 7 (Elem-Ex 7) and Comparative Example 7 (Elem-Comp 7).

TABLE 15

| Elem. No. | Self-bias upon form of i-type layer (V) | Conversion Efficiency | Open-circuit Voltage | Current Density | F.F. |
|---|---|---|---|---|---|
| Elem-Ex 7 | +18 | 1.03 | 1.01 | 1.01 | 1.01 |
| Elem-Comp 7 | −55 | 1.00 | 1.00 | 1.00 | 1.00 |

TABLE 16

| Element No. | Dispersion of conversion efficiency | Yield (%) |
|---|---|---|
| Elem-Ex 7 | 1.07 | 99 |
| Elem-Comp 7 | 1.00 | 96 |

As shown in Table 15 and Table 16, the photovoltaic element of Example 7 (Elem-Ex 7) was superior in both characteristic uniformity and yield to the photovoltaic element of Comparative Example 7 (Elem-Comp 7), so that the single type photovoltaic element fabricated by the fabrication method of the present invention was found to have the excellent characteristics, thus proving the effect of the present invention.

Examples 8 to 11 of fabrication of photovoltaic element (examination of deposition rate)

The flow rate of $SiH_4$ gas introduced into the i-layer forming container was changed in the range of from 60 to 100 sccm, thereby changing the deposition rate. Single type photovoltaic elements were fabricated in the same procedures as in Example 7 except for the above point and except that the fabrication conditions as shown in Table 17 were employed (Elem-Ex 8 to 11).

TABLE 17

Substrate: SUS430BA 0.13 mm thick
Reflective layer: Silver (Ag) thin film 100 nm
Reflection enhancing layer: Zinc oxide (ZnO) thin film 1 µm
Gate gas: 700 sccm from each gate

| Name of Layer | Thickness of Layer (nm) | Used Gas and Flow Rate (sccm) | RF Power (W) | Pressure (Torr) | Substrate Temp. (°C.) |
|---|---|---|---|---|---|
| 1st-conductivity type layer | 40 | $SiH_4$ 40 $PH_3/H_2$ 50 (2%dil) $H_2$ 500 | 800 | 1.5 | 350 |
| i-type layer | 140 | $SiH_4$ 60 to 100 $H_2$ 200 | 80 to 120 | 1.8 | 300 |
| 2nd-conductivity type layer | 20 | $SiH_4$ 10 $BF_3/H_2$ 100 (2%dil) $H_2$ 2000 | 800 | 1.6 | 250 |

Transparent electrode: ITO ($In_2O_3$ + $SnO_2$) thin film 80 nm
Collector electrode: Aluminum (Al) thin film 2 µm At the same time as it, values of the self-bias occurring in the cathode electrode were also checked and connection thereof with the characteristics of photovoltaic element was evaluated.

Comparative Examples 8 to 11

Single type photovoltaic elements were fabricated in the same procedures as those in Example 8 except that the electrode structure of the cathode electrode for the i-layer was the cathode electrode structure shown in FIG. 2 (in this case, the ratio of the cathode area to the total area of the ground anode including the electroconductive beltlike member was 0.6) and that the fabrication conditions as shown in Table 18 were employed (Elem-Comp 8 to 11).

TABLE 18

Substrate: SUS430BA 0.13 mm thick
Reflective layer: Silver (Ag) thin film 100 nm
Reflection enhancing layer: Zinc oxide (ZnO) thin film 1 µm
Gate gas: 700 sccm from each gate

| Name of Layer | Thickness of Layer (nm) | Used Gas and Flow Rate (sccm) | RF Power (W) | Pressure (Torr) | Substrate Temp. (°C.) |
|---|---|---|---|---|---|
| 1st-conductivity type layer | 40 | $SiH_4$ 40 $PH_3/H_2$ 50 (2%dil) $H_2$ 500 | 800 | 1.5 | 350 |
| i-type layer | 140 | $SiH_4$ 80 to 120 $H_2$ 500 | 180 to 220 | 1.8 | 300 |
| 2nd-conductivity type layer | 20 | $SiH_4$ 10 $BF_3/H_2$ 100 (2%dil) $H_2$ 2000 | 800 | 1.6 | 250 |

Transparent electrode: ITO ($In_2O_3$ + $SnO_2$) thin film 80 nm

TABLE 18-continued

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (°C) |
|---|---|---|---|---|---|

Collector electrode: Aluminum (Al) thin film 2 μm

Results of measurement and evaluation of photoelectric conversion efficiency are shown in Table 19. Each value is a relative value when the characteristic of Elem-Comp 8 is referenced to 1.00.

TABLE 19

| Element No. | Deposition rate of i-type layer (Å/sec) | Self-bias upon discharge for i-type layer (V) | Conversion Efficiency |
|---|---|---|---|
| Elem-Ex 8 | 0.6 | +5 | 1.03 |
| Elem-Ex 9 | 1.0 | +10 | 1.03 |
| Elem-Ex 10 | 1.2 | +16 | 1.02 |
| Elem-Ex 11 | 1.5 | +19 | 1.02 |
| Elem-Comp 8 | 0.6 | −26 | 1.00 |
| Elem-Comp 9 | 1.0 | −29 | 0.99 |
| Elem-Comp 10 | 1.2 | −32 | 0.95 |
| Elem-Comp 11 | 1.5 | −36 | 0.93 |

The open-circuit voltages of Elem-Ex 8 to 11 are totally improved as compared with Elem-Comp 8 and as a result, the conversion factors are improved. Especially, where the ratio of the cathode electrode area is set large (Elem-Ex 8 to 11), drops of characteristics can be restricted even at the large deposition rates. On the other hand, where the ratio of the cathode electrode area is set small (Elem-Comp 8 to 11), the open-circuit voltages drop with increasing deposition rates, which decreases the conversion efficiencies.

As shown in Table 19, the photovoltaic elements of Examples 8-11 (Elem-Ex 8 to 11) are superior in the conversion efficiency to those of Comparative Examples 8–11 (Elem-Comp 8 to 11), and it was found that as long as the photovoltaic elements were fabricated under the conditions that the cathode area was greater than the anode area and that the self-bias was of a positive potential, the photovoltaic elements would have excellent characteristics even with increasing deposition rates, thus proving the effect of the present invention.

Examples 12 to 22 of fabrication of photovoltaic element

Figure 6:
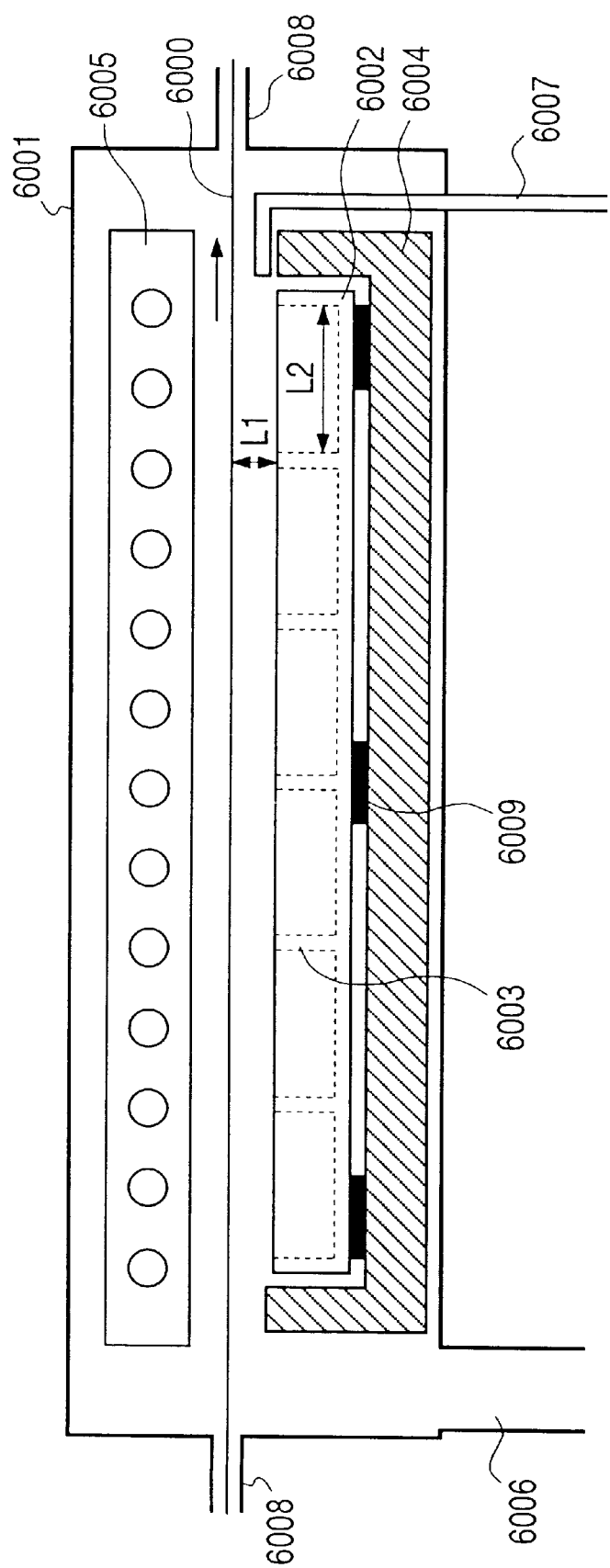
FIG. 6 is a cross-sectional view of a deposit film forming apparatus of the present invention.
Figure 7:
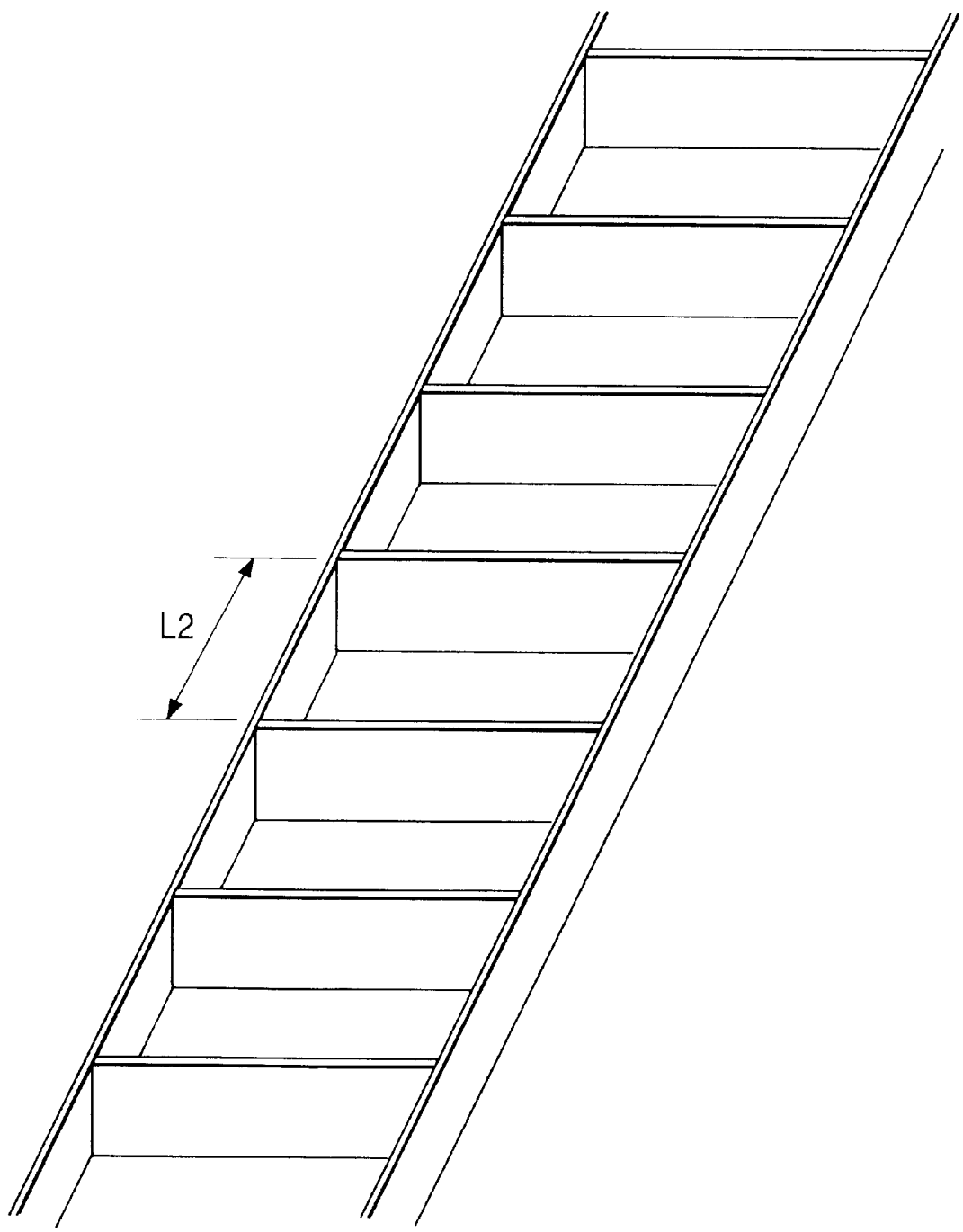
FIG. 7 is an example of the cathode electrode of the present invention.

Examined herein were the spacing between the cathode electrode and the substrate and the spacing between fins of the cathode electrode. Referring to FIG. 6, in a deposition chamber 6001 through which an elongated substrate 6000 passes there are provided cathode electrode 6002 having fins 6003, ground anode electrode 6004, and heater 6005. The raw-material gas was supplied from a gas supply tube 6007 and evacuated through an exhaust tube 6006. The configuration of the cathode electrode is shown in FIG. 7.

The spacing between the cathode electrode 6002 and the substrate 6000 is represented by L1, and the spacing between the fins by L2.

This apparatus was used for fabrication of the p-layer of single cell. The fabrication conditions are shown in Table 20.

TABLE 20

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (°C) |
|---|---|---|---|---|---|
| 1st-conductivity type layer | 40 | $SiH_4$ 40 $PH_3/H_2$ 50 (2%dil) $H_2$ 500 | 800 | 1.5 | 350 |
| i-type layer | 140 | $SiH_4$ 100 each $H_2$ 500 each | 200 | 1.8 | 300 |
| 2nd-conductivity type layer | 20 | $SiH_4$ 10 $BF_3/H_2$ 100 (2%dil) $H_2$ 500 | 600 | 1.6 | 250 |

Transparent electrode: ITO ($In_2O_3$ + $SnO_2$) thin film 80 nm
Collector electrode: Aluminum (Al) thin film 2 μm

Comparative Example 12

With the conventional apparatus shown in FIG. 2, a single cell was fabricated under the conditions shown in Table 21.

TABLE 21

Substrate: SUS430BA 0.13 mm thick
Reflective layer: Silver (Ag) thin film 100 nm
Reflection enhancing layer: Zinc oxide (ZnO) thin film 1 μm
Gate gas: 700 sccm from each gate

| Name of Layer | Thickness of Layer (nm) | Used Gas and Flow Rate (sccm) | RF Power (W) | Pressure (Torr) | Substrate Temp. (°C) |
|---|---|---|---|---|---|
| 1st-conductivity type layer | 40 | $SiH_4$ 40 $PH_3/H_2$ 50 (2%dil) $H_2$ 500 | 800 | 1.5 | 350 |
| i-type layer | 140 | $SiH_4$ 100 each $H_2$ 500 each | 200 | 1.8 | 350 |
| 2nd-conductivity type layer | 10 | $SiH_4$ 10 $BF_3/H_2$ 100 (2%dil) $H_2$ 2000 | 800 | 1.6 | 250 |

Transparent electrode: ITO ($In_2O_3$ + $SnO_2$) thin film 80 nm
Collector electrode: Aluminum (Al) thin film 2 μm The conversion efficiency, open-circuit voltage, current density, and fill factor were measured for the elements (Elem-Ex 12 to 16) as changing the spacing L1 between the cathode electrode and the substrate from 0.2 to 6 cm.

TABLE 22

| Elem. No. | Space L1 (cm) | Conversion Efficiency | Open-circuit Voltage | Current Density | F.F. |
|---|---|---|---|---|---|
| Elem-Ex 12 | 0.2 | 1.05 | 1.03 | 1.01 | 1.01 |
| Elem-Ex 13 | 1 | 1.04 | 1.02 | 1.01 | 1.01 |
| Elem-Ex 14 | 3 | 1.03 | 1.01 | 1.01 | 1.01 |
| Elem-Ex 15 | 5 | 1.03 | 1.01 | 1.01 | 1.01 |
| Elem-Ex 16 | 6 | 1.01 | 1.00 | 1.00 | 1.00 |
| Elem-Comp 12 | — | 1.00 | 1.00 | 1.00 | 1.00 |

Similar data was measured for the elements (Elem-Ex 17 to 22) as changing the spacing between the fins of the cathode electrode from 1 to 12 cm.

TABLE 23

| Elem. No. | Space L2 (cm) | Conversion Efficiency | Open-circuit Voltage | Current Density | F.F. |
|---|---|---|---|---|---|
| Elem-Ex 17 | 1 | 1.01 | 1.00 | 1.00 | 1.00 |
| Elem-Ex 18 | 2 | 1.03 | 1.01 | 1.01 | 1.01 |
| Elem-Ex 19 | 4 | 1.05 | 1.03 | 1.01 | 1.01 |
| Elem-Ex 20 | 7 | 1.04 | 1.02 | 1.01 | 1.01 |
| Elem-Ex 21 | 10 | 1.03 | 1.01 | 1.01 | 1.01 |
| Elem-Ex 22 | 12 | 1.01 | 1.00 | 1.00 | 1.00 |
| Elem-Comp 12 | — | 1.00 | 1.00 | 1.00 | 1.00 |

It is seen from Table 22 that the spacing between the cathode electrode and the substrate can be determined preferably in the range of not more than 5 cm.

It is also seen from Table 23 that the spacing between the fins can be determined desirably in the range of 2 cm to 10 cm both inclusive.

The same was found to be applicable when the present invention was applied to fabrication of the i-layer.

Apparatus Example 2

Next shown is a deposit film forming apparatus for introducing different gas species independently of each other through a plurality of gas inlet tubes as a material gas introducing means.

Figure 8A:
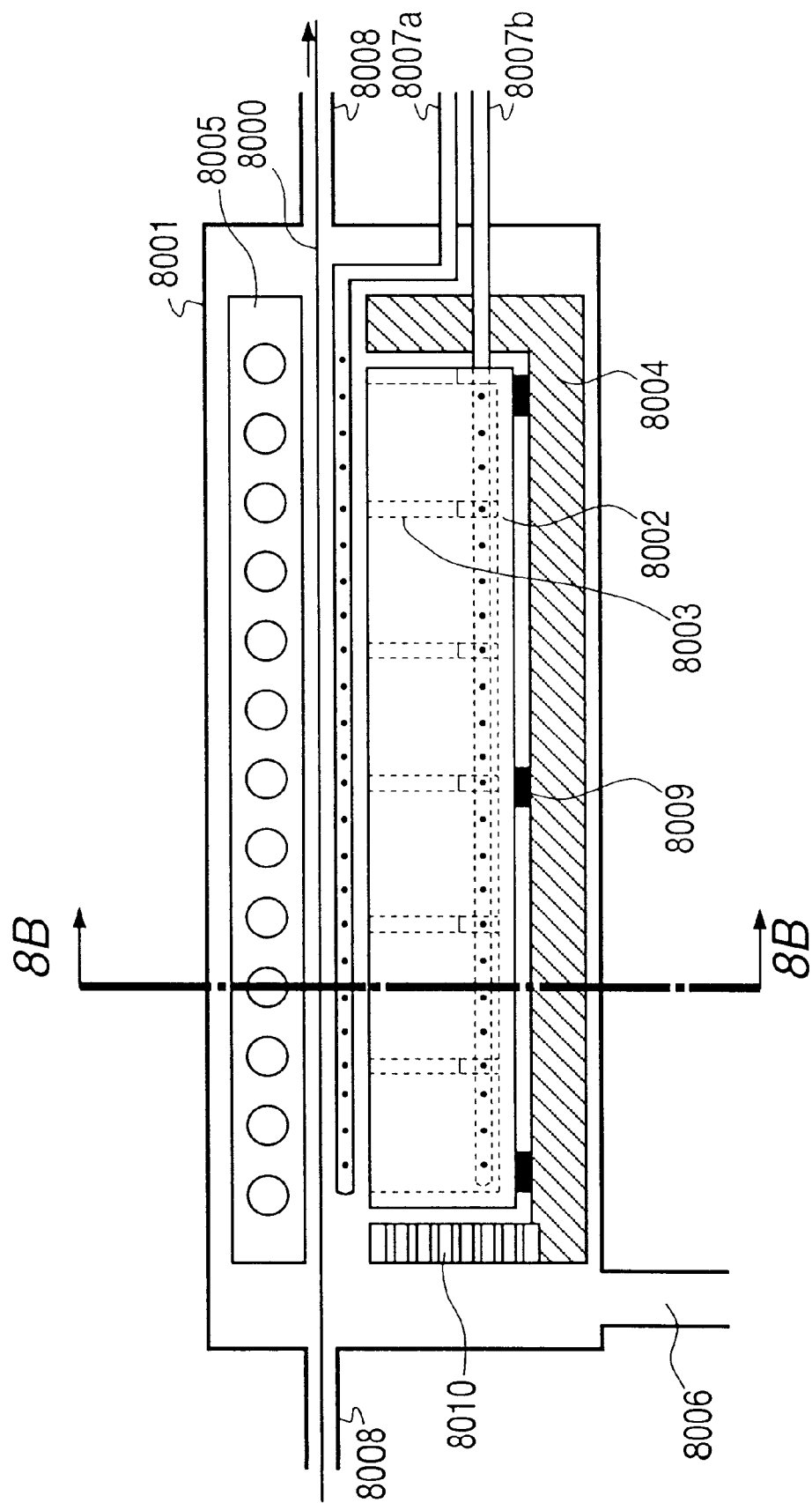

FIG. 8A is a schematic cross-sectional view of the apparatus, taken along the direction parallel to the conveying direction, to show the feature in the discharge container of the present invention. FIG. 8B is a schematic cross-sectional view of the apparatus, taken along the direction perpendicular to the conveying direction (a cross section along 8B—8B in FIG. 8A). This example employs the cathode electrode with partitions having the same structure as the cathode electrode example as shown in FIG. 1D.

In FIGS. 8A and 8B, the cathode electrode 8002 with partitions 8003 is set above the ground (anode) electrode 8004 as being electrically insulated by insulator 8009. As being supported by a plurality of magnet rollers not shown, the electroconductive beltlike member 8000 moves above the cathode electrode and in the direction represented by an arrow without physical contact with the cathode electrode located thereunder and with the lamp heater located thereabove.

A doping gas or, a gas containing an additive is introduced through ceramic gas inlet tube 8007a to the proximity of the surface of the beltlike member. On the other hand, a film-forming gas such as silane and a diluent gas such as hydrogen are introduced through ceramic gas inlet tube 8007b, so disposed as to penetrate the cathode electrode, to regions relatively apart from the surface of the beltlike member.

The gases pass through the discharge space between the beltlike member and the cathode electrode and then is evacuated by an unrepresented vacuum pump from exhaust port 8006 through punching board 8010. The material for the cathode electrode and anode electrode may be stainless steel, aluminum, or the like.

Discharge regions of glow discharge occurring with application of RF power from an unrepresented RF power supply to the cathode electrode include gaps between the plural partition electrodes 8003 being parts of the cathode electrode, and the space between the beltlike member and the cathode electrode, which are regions confined by the electroconductive beltlike member located above.

The distance between the substrate and the cathode electrode is determined preferably in the range of approximately 5 or less cm, as described above. Further, the spacing between the plural partition electrodes 8003 is determined preferably in the range of 2 cm to 10 cm both inclusive.

This apparatus was used for forming the p-layer of single cell. According to observation of cross-sectional TEM images thereof, microcrystals were recognized in the p-layer.

What is claimed is:

1. A thin film manufacturing method by plasma CVD comprising supplying power to a power electrode such that a self-bias upon plasma discharge of the power applying electrode disposed in a plasma discharge space is a positive potential relative to a ground electrode.

2. The thin film manufacturing method according to claim 1, wherein a surface area of said power applying electrode is greater than a surface area of the whole of said ground electrode.

3. The thin film manufacturing method according to claim 1, wherein said thin film is a p-type or n-type semiconductor, and said self-bias is not less than +30 V.

4. The thin film manufacturing method according to claim 1, wherein said thin film is an i-type semiconductor and said self-bias is not less than +5 V.

5. The thin film manufacturing method according to claim 1, wherein said thin film comprises microcrystals.

6. The thin film manufacturing method according to claim 1, wherein a deposition rate of said thin film is not less than 1 Å/sec.

7. The thin film manufacturing method according to claim 1, wherein said thin film is formed on an elongate substrate.

8. The thin film manufacturing method according to claim 1, wherein said elongate substrate is comprised of metal or resin.

9. The thin film manufacturing method according to claim 1, wherein different gas species are introduced independently of each other through a plurality of gas inlet tubes.

10. The thin film manufacturing method according to claim 9, wherein at least one tube of said plurality of gas inlet tubes is for introducing a doping gas and/or a gas containing an additive to near the substrate and another pipe is for introducing a gas containing silicon and/or a diluent gas to a region apart from the substrate.

11. The thin film manufacturing method according to claim 9, wherein said additive is one selected from the group consisting of germanium, carbon, nitrogen, and oxygen.

* * * * *

UNITED STATES PATENT AND TRADEMARK OFFICE
CERTIFICATE OF CORRECTION

PATENT NO. : 5,927,994

DATED : July 27, 1999

INVENTOR(S) : YUZO KOHDA ET AL.

Page 1 of 2

It is certified that error appears in the above-identified patent and that said Letters Patent is hereby corrected as shown below:

COLUMN 1

Line 22, "elongate" should read --elongated--; and
Line 44, "more)" should read --more),--.

COLUMN 3

Line 45, "$B_4H_1O$," should read --$B_4H_{10}$,--.

COLUMN 5

Line 56, "non-monocrystal" should read --non-monocrystalline--; and
Line 64, "1x10-4" should read --$1x10^{-4}$--.

COLUMN 8

Line 11, "anode" should read --anode area--.

COLUMN 10

Line 49, "800   1.5      " should read --800   1.5   350--.

UNITED STATES PATENT AND TRADEMARK OFFICE
CERTIFICATE OF CORRECTION

PATENT NO. : 5,927,994

DATED : July 27, 1999

INVENTOR(S) : YUZO KOHDA ET AL.

It is certified that error appears in the above-identified patent and that said Letters Patent is hereby corrected as shown below:

COLUMN 12

Line 34, "as it," should be deleted; and
Line 43, "element" should read --elements--.

COLUMN 16

Line 27, "as it," should be deleted.

Signed and Sealed this

Sixteenth Day of May, 2000

*Attest:*

Q. TODD DICKINSON

*Attesting Officer*      *Director of Patents and Trademarks*